(12) United States Patent
Mauder et al.

(10) Patent No.: US 7,317,252 B2
(45) Date of Patent: Jan. 8, 2008

(54) OHMIC CONTACT CONFIGURATION

(75) Inventors: Anton Mauder, Kolbermoor (DE);
Hans-Joachim Schulze, Ottobrunn (DE); Helmut Strack, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/686,849

(22) Filed: Oct. 16, 2003

(65) Prior Publication Data

US 2004/0080015 A1 Apr. 29, 2004

(30) Foreign Application Priority Data

Oct. 16, 2002 (DE) ................. 102 48 205

(51) Int. Cl.
*H01L 23/48* (2006.01)
(52) U.S. Cl. .................. 257/750; 257/734; 257/758
(58) Field of Classification Search ........... 257/734, 257/750, 758
See application file for complete search history.

(56) References Cited

U.S. PATENT DOCUMENTS

| 5,156,994 | A | | 10/1992 | Moslehi |
| 5,631,189 | A | * | 5/1997 | Kobayashi et al. ......... 438/448 |
| 5,873,984 | A | * | 2/1999 | Cheng et al. ........... 204/192.16 |
| 5,915,197 | A | | 6/1999 | Yamanaka et al. |
| 6,139,624 | A | | 10/2000 | Rupp |
| 6,440,828 | B1 | * | 8/2002 | Sato et al. .................. 438/533 |
| 2003/0122151 | A1 | | 7/2003 | Mauder et al. |
| 2004/0171204 | A1 | * | 9/2004 | Slater et al. ................ 438/200 |

FOREIGN PATENT DOCUMENTS

| DE | 195 14 081 A1 | 10/1996 |
| DE | 100 06 378 C2 | 9/2001 |
| DE | 100 31 461 A1 | 1/2002 |
| JP | 63-29503 | 2/1988 |
| JP | 2000208437 A | 7/2000 |
| WO | 96/13061 | 5/1996 |
| WO | 01/84609 A1 | 11/2001 |

\* cited by examiner

*Primary Examiner*—Long Pham
(74) *Attorney, Agent, or Firm*—Laurence A. Greenberg; Werner H. Stemer; Ralph E. Locher

(57) ABSTRACT

A contact configuration has an ohmic contact between a metalization layer and a semiconductor body of monocrystalline semiconductor material. An amorphous semiconductor layer is formed between the metalization layer and the monocrystalline semiconductor body. The layer is formed of the same semiconductor material as the body. The contact configuration is either produced by applying amorphous semiconductor material on the semiconductor body (e.g., sputtering, vapor deposition, glow discharge) or by damage formation in the semiconductor body.

15 Claims, 2 Drawing Sheets

OHMIC CONTACT CONFIGURATION

BACKGROUND OF THE INVENTION

Field of the Invention

The present invention lies in the semiconductor technology field. More specifically, the invention relates to a contact configuration with an ohmic contact between a metalization layer and a semiconductor body made of a monocrystalline semiconductor material.

In order to produce an ohmic contact between a metalization layer and a semiconductor body, a sufficiently high doping concentration is required in the semiconductor material of the semiconductor body. By way of example, if the metalization layer comprises aluminum and the semiconductor body comprises p-doped silicon, then the doping concentration in the surface region of the semiconductor body with respect to the metalization layer should be at least $10^{17}$ doping atoms cm$^{-3}$. If the silicon of the semiconductor body is n-doped, then a surface doping concentration of even in excess of $10^{19}$ dopant atoms cm$^{-3}$ is required.

These minimum doping concentrations pose a problem if the regions of the semiconductor body that adjoin the contact region with respect to the metalization layer are not intended to have a high emitter efficiency. This is because the injection behavior of an emitter depends crucially on the dopant dose introduced into its region. In a semiconductor body, however, even with a deposition very near the surface for example by way of ion implantation and a subsequent annealing step, high surface doping concentrations cannot be produced with arbitrarily small dopant doses of the order of magnitude of less than $10^{13}$ dopant atoms cm$^{-2}$, for example, without significant redistribution.

At the present time, the contact to the body zone in power MOSFETs and IGBTs (insulated gate bipolar transistor) is preferably connected to the source electrode by a heavily doped p-conducting region with the lowest possible resistance in order that the pn junction between body zone and source zone is not forward-biased with respect to the source zone in the event of a high shunt current. For this would lead to a so-called "latch-up" of the power MOSFET or IGBT, which prevents controllability via the gate and brings about destruction of the power MOSFET or IGBT in the absence of external additional measures.

The body diode thus integrated between body zone and source zone has the effect, in a power MOSFET or IGBT, that the latter is very heavily flooded with charge carriers in the reverse direction. The commutation properties of the body diode are very poor due to the high p-type doping of the body zone on the front side of the power MOSFET. By contrast, IGBTs exhibit a certain reverse blocking capability due to the rear-side pn junction with respect to the collector zone. Here, the IGBT is already flooded with charge carriers in normal forward operation, which charge carriers then have to be depleted in the event of transition to the blocking state. The resultant charge carrier current to the cell then has to be conducted away with a sufficiently low resistance via the p-conducting body zone to the body contact.

It is quite generally the case with bipolar transistors and diodes that a relatively high doping of the regions in the vicinity of the metalization layer with which contact is to be made leads to an often undesirably strong emitter, which results in a correspondingly high degree of flooding of the component with charge carriers and thus in higher switching losses.

In the prior art, the use of power MOSFETs in group circuits in particular at relatively high voltages of above about 300 V has been possible only to a very limited extent. At relatively low voltages of below 300 V, the switching losses in such power MOSFETs are relatively high. At the present time, the required latch-up strength of power MOSFETs or IGBTs is ensured through precise design of their cells and complicated fabrication methods.

In the case of bipolar transistors and diodes, low emitter efficiencies can be ensured on the one hand through correspondingly low dopant doses and on the other hand through optimized doping methods. Reference is had, in this context, to the commonly assigned published application U.S. Ser. No. 2003/0122151 A1 and German published patent application DE 100 31 461 A1, for example, which describe a high-voltage diode wherein the doping concentrations of an anode region and of a cathode region are optimized with regard to the basic functions of "static blocking" and "forward state." However, all of these measures are usually insufficient for achieving a weak emitter that is desired in many cases.

For this reason, it is necessary to employ additional methods by which a subsequent weakening of the emitter efficiency is achieved by means of local or homogeneous setting of the charge carrier lifetime. What is particularly of significance here is a lowering of the charge carrier lifetime through local damage of the semiconductor crystal lattice in or in the vicinity of the emitter by irradiation with high-energy particles such as, for example, electrons, protons or helium atoms. What is disadvantageous about such a procedure, however, is once again the susceptibility of completed components to process variations.

SUMMARY OF THE INVENTION

It is accordingly an object of the invention to provide an ohmic contact configuration, which overcomes the above-mentioned disadvantages of the heretofore-known devices and methods of this general type and specifies a configuration with an ohmic contact between a metalization layer and a semiconductor body that can be produced in a simple manner and is able to ensure a low emitter efficiency. Moreover, the intention is to provide an advantageous method for producing such a contact configuration.

With the foregoing and other objects in view there is provided, in accordance with the invention, a contact configuration, comprising:

a semiconductor body of semiconductor material in a monocrystalline phase;

a metalization layer; and a layer of said semiconductor material in a substantially amorphous phase disposed between said semiconductor body and said metalization layer, for forming an ohmic contact between said metalization layer and said semiconductor body.

In other words, a contact configuration of the type mentioned in the introduction is provided with a layer made of the amorphous semiconductor material of the semiconductor body, the layer being provided between the semiconductor body and the metalization layer.

The invention is thus based on the completely novel insight concerning the usability of amorphous silicon: previously, amorphous silicon has been used for anti-reflection layers and for passivation. The invention now envisages that amorphous silicon may serve, this being completely novel, as a contact material between a metalization layer and a semiconductor body comprising silicon.

However, the invention is not restricted to silicon: rather, it can generally also be applied to other semiconductor materials, such as, for example, to silicon carbide, compound semiconductors etc. Thus, by way of example, an amorphous silicon carbide layer can effect an ohmic contact between a metalization layer and a silicon carbide semiconductor body.

The contact configuration according to the invention thus enables an ohmic junction between, in particular, a lightly doped silicon semiconductor body and a metalization layer applied thereto by an intermediate layer made of amorphous silicon being deposited onto the silicon of the semiconductor body. On account of its high defect density, amorphous silicon has the desired property of forming an ohmic contact between the amorphous silicon layer, on the one hand, and the metalization layer deposited thereon, on the other, as well as between the amorphous silicon layer on the one hand, and the crystalline silicon of the semiconductor body on the other hand. This specifically holds true even when the preferably n-conducting doping in the amorphous silicon layer is present only in a low concentration.

Amorphous silicon vapor-deposited or sputtered onto a silicon semiconductor body is generally n-conducting after a heat treatment which follows its deposition, which heat treatment may preferably proceed at about 350° C. to 450° C. In this case, the amorphous silicon may already contain a relatively high concentration of hydrogen, depending on its production process. Since the sheet resistance that results in an amorphous silicon layer is relatively high, it may be expedient for hydrogen atoms additionally to be incorporated into the amorphous silicon layer in order to increase the n-type doping in a targeted manner.

The incorporation of the hydrogen atoms into the amorphous silicon layer may be effected for example by the heat treatment which follows the deposition, and which is carried at about 350° C. to 450° C., being performed in a hydrogen-containing atmosphere. A further possibility consists in producing the amorphous silicon layer by means of a glow discharge process in a silane atmosphere ($SiH_4$ atmosphere) or else in carrying out the sputtering process itself in a hydrogen-containing atmosphere.

A primary advantage of the contact configuration according to the invention is that it enables an ohmic contact on an n-doped or else p-doped semiconductor body, and in particular on a silicon semiconductor body, without the need for the contact to have a high emitter efficiency, since the emitter efficiency remains low due to the amorphous structure of the deposited layer.

In addition to or instead of the doping by means of hydrogen, it is also possible to provide an amorphous silicon layer with other n-doping substances, such as phosphorus, for example. Such an additional doping is preferably performed since hydrogen-doped silicon can be electrically actively doped more easily with phosphorus, for example, or else—for the case of a targeted p-doping—with boron, for example.

The contact configuration according to the invention is advantageously employed for example for the source contact of a MOS component, that is to say of a MOSFET or IGBT, for example. In the case of such a MOSFET component, it is possible to dispense with a short circuit between body zone and source zone owing to the poor emitter efficiency. In this case, n-doped amorphous silicon can be deposited either directly on a p-doped semiconductor body (bulk) as source zone or channel terminal or on a more weakly n-doped source zone as contact material.

If such an n-doped emitter is employed for diode structures, then the possibility of producing defects in the depth of the silicon semiconductor body through an additional irradiation by means of protons or helium atoms is also afforded, which defects may be provided with hydrogen during the above-described heat treatment process and then form donors. This process can thus be used to form an upstream field stop zone which is desired for many diode structures and, inter alia, leads to a softer switch-off (this will be discussed in more detail further below in connection with FIG. 1). This zone may also lead to a targeted raising of the emitter efficiency. However, it is also possible to provide a raising of the emitter efficiency of that semiconductor region of the semiconductor body which is coated with amorphous silicon through an additional moderate conventional doping of the crystalline silicon region situated in direct proximity to the amorphous silicon layer, for example by means of phosphorus atoms in the case of an n-type doping and for example by means of boron atoms in the case of a p-type doping.

In principle, it is also possible to use the contact configuration according to the invention to produce a stable ohmic contact on a lightly doped p-conducting region for an IGBT, for example. This contact is likewise distinguished by a low emitter efficiency. In this case, the amorphous silicon may also be produced in p-conducting fashion through suitable doping. In this case, too, the emitter efficiency may easily be raised as required through a moderate additional doping of the region of the crystalline silicon which is situated in the region of the interface with the amorphous silicon layer. Thus, in IGBTs for relatively high switching frequencies, at the present time preferably weak p-conducting emitters are used for reducing the switch-off losses. The use of amorphous silicon as contact material in this case makes it possible to further reduce the p-type dose and thus the switching losses. At the present time, the minimum emitter efficiency is limited here by the ohmic contact-connectability.

The contact configuration according to the invention makes it possible to protect specific regions in components which become very hot on account of instances of current splitting by the efficiency of an n- or p-conducting emitter formed by an amorphous silicon layer being locally attenuated in the critical component regions. Such an amorphous silicon layer can be produced in a self-aligning manner by exploiting the effect that amorphous silicon starts to recrystallize at temperatures in the range above 600° C., which increases the contact resistance. Thus, if the component is operated above a noncritical current density range over a certain period of time, then the injection can also be locally attenuated on account of the local temperature increase and the locally increased contact resistance resulting therefrom. This reduces the injection of such an emitter in the critical component regions, that is to say for example in the edge region of diodes during dynamic operation or, in pressure contact IGBTs, in the region situated below the edge of the pressure piece. This leads to a load relief during switch-off in the edge region in the case of the diodes, for example.

In an advantageous manner, in the case of a contact configuration with a hydrogen-containing and generally additionally doped silicon layer, an outdiffusion of hydrogen atoms, which already occurs to an appreciable extent at temperatures in the region of 400° C., already suffices to impair the injection behavior of the emitter in locally targeted fashion. An alternative without utilizing this effect is locally reducing the emitter efficiency by locally driving out the doping from the amorphous silicon by means of a locally delimited input of heat from outside. Such an input of heat may be effected for example by means of a heated grid or through radiation which acts locally, such as laser radiation for example, or is locally shielded, which can be done for example by means of a screen in an RTA furnace (RTA=Rapid Thermal Annealing). It is also possible to allow the radiation to act in pulsed fashion.

The contact configuration according to the invention may be produced by deposition by means of vapor deposition or sputtering of amorphous semiconductor material, such as, in particular, silicon or silicon carbide. However, it is also possible not to deposit the amorphous semiconductor material but rather to amorphize the surface of monocrystalline semiconductor material. With silicon, then, no amorphous silicon is deposited in this case. Rather, monocrystalline silicon is subjected to a damage process in order to amorphize it in regions where the intention is to create a contact configuration with an ohmic contact.

It is advantageous, particularly for contact configurations on the rear side of a semiconductor wafer, to produce a damage by means of an implantation with a non-doping element. With this procedure, the actual emitter is then implanted particularly shallowly, so that practically all of the implanted atoms remain in the region of the damage. As an alternative, there may be a low dose of this emitter in the crystalline region as well, wherein case this dose should be so low that the targeted weak emitter efficiency is not exceeded. Elements of the third period of the periodic table, such as silicon or argon, for example, are preferably suitable for a damage implantation. These elements have a relatively low amorphization dose in the region of $5 \cdot 10^{14}$ cm$^{-2}$ and, on the other hand, have significantly greater penetration depths than elements of the fourth period of the periodic table.

Other features which are considered as characteristic for the invention are set forth in the appended claims.

Although the invention is illustrated and described herein as embodied in an ohmic contact configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
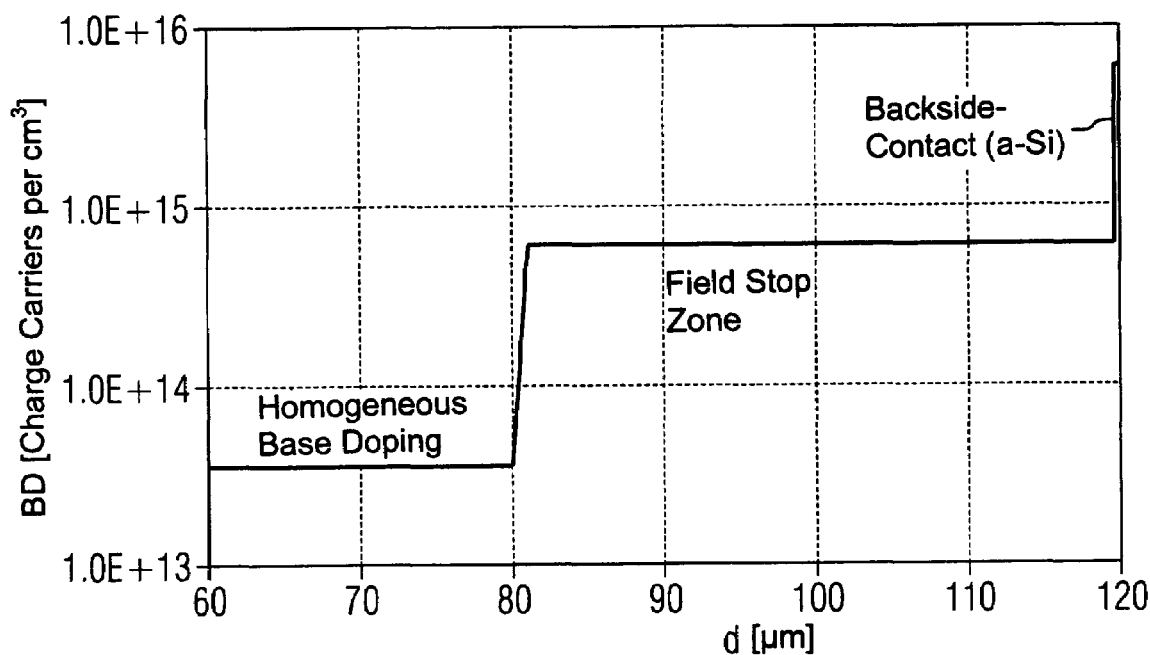
FIG. 1 is a graph plotting a fundamental doping profile of a 1200 V diode, with the doping plotted as a function of an anode distance.

Referring now to the figures of the drawing in detail and first, particularly, to FIG. 1 thereof, there is shown a fundamental doping profile of a 1200 V diode with the contact configuration according to the invention. In this case, the basic doping BD in charge carriers/cm$^3$ is plotted as a function of a distance d from the anode of the diode in μm. In the case of this diode, a rear-side contact comprises amorphous silicon (a-Si) and has a basic doping of between $10^{13}$ and $10^{14}$ charge carriers cm$^{-3}$. The doping profile firstly exhibits a region with a homogeneous basic doping, followed by a field stop zone with a high doping. This field stop zone then undergoes transition to a layer made of amorphous silicon on the rear side of the diode.

The field stop zone may be produced for example through an additional irradiation by means of protons or helium atoms. The protons or helium atoms produce defects in the depth of the semiconductor body, which defects are provided with hydrogen during a heat treatment process after the deposition of the amorphous silicon layer and form donors. Whereas the hydrogen is already present in the semiconductor body in the case of proton implantation, in the case of prior helium implantation it first has to be indiffused for example from the vapor phase or a plasma. The donors increase the doping in the region of the field stop zone above the homogeneous basic doping. The field stop zone has the advantage that it ensures, inter alia, a softer switch-off of the diode.

Figure 2:
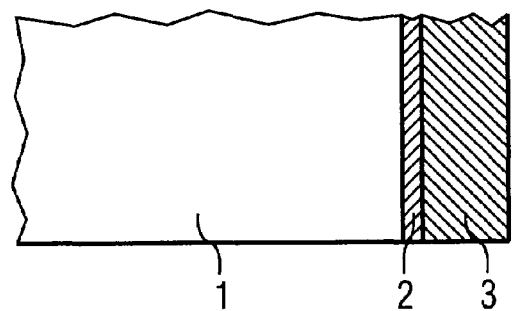
FIG. 2 is a diagrammatic sectional illustration through a contact configuration according to the invention.

FIG. 2 shows a diagrammatic sectional illustration through the contact configuration according to the invention. An amorphous semiconductor layer 2 is disposed on a semiconductor body 1 made of monocrystalline silicon or monocrystalline silicon carbide, for example. The amorphous semiconductor layer 2 is likewise made of silicon or silicon carbide. The layer thickness of the layer 2 is in the nm range and may, for example, lie between 2 nm and 100 nm or a few 100 nm. The doping concentration in the layer 2 is relatively low and, for example, lies between $10^{15}$ and $10^{16}$ charge carriers cm$^{-3}$.

A metalization layer 3 is applied as contact on the layer 2. By way of example, aluminum or chromium or aluminum/chromium may be used for the metalization layer 3.

Figure 3:
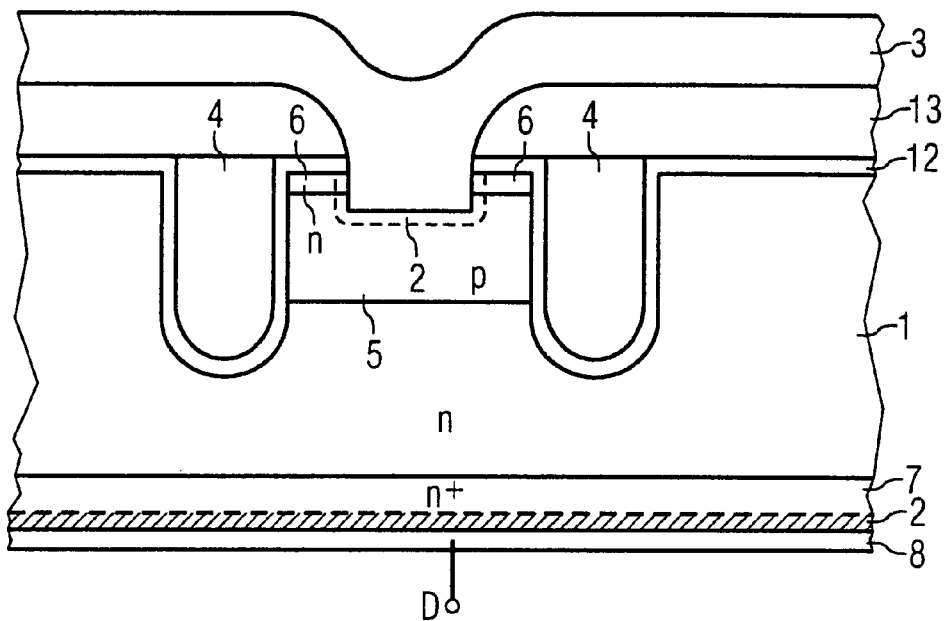
FIG. 3 is a sectional view of a trench component with the contact configuration according to the invention.

FIG. 3 shows, as a concrete exemplary embodiment of the contact configuration according to the invention, a sectional illustration through a vertical trench MOSFET with an n-doped silicon semiconductor body 1 into which are introduced trenches 4 filled with polycrystalline silicon as gate electrode. A p-doped body zone 5 is situated in the semiconductor body 1, at the top side thereof, an n-doped source zone 6 being provided in turn at the top side of the body zone. The source zone 6 and the body zone 5 are contact-connected by a metalization layer 3 made of aluminum.

An n$^+$-doped terminal zone 7 is additionally provided on the rear side of the semiconductor body 1. A drain contact 8 (D) is provided on the terminal zone.

According to the invention, the body zone 5 and the source zone 6, on the one hand, and/or the n$^+$-conducting contact zone 7 are now provided with a p-doped or n-doped layer 2 made of amorphous silicon. The layer 2 may be produced by vapor deposition, as has been explained above, or else by amorphization.

Figure 4:
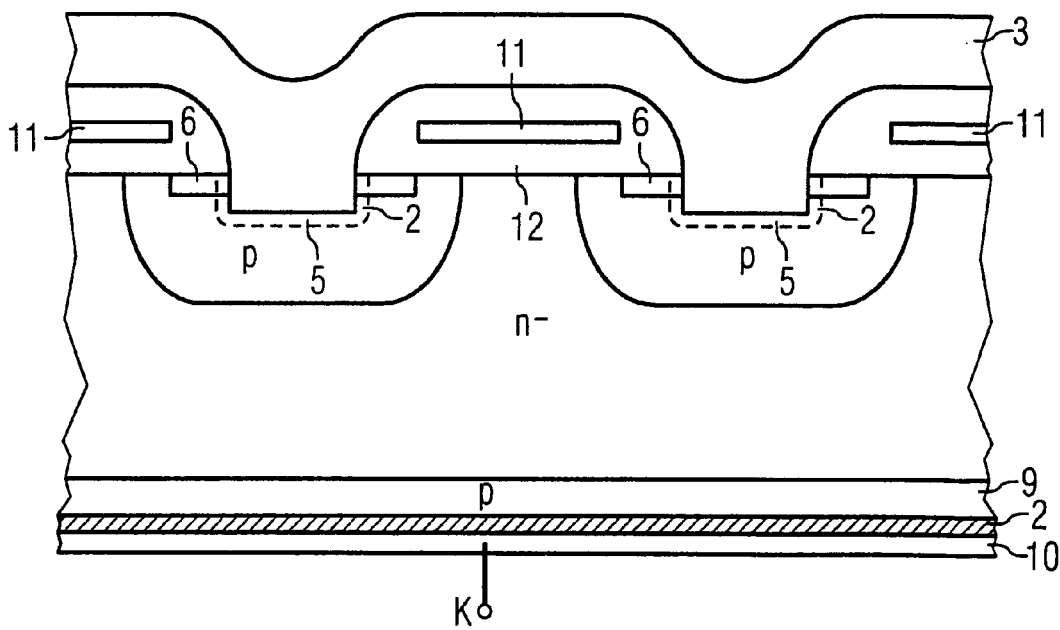
FIG. 4 is a sectional view of a planar component with the contact configuration according to the invention.

FIG. 4 shows, as a further exemplary embodiment of the contact configuration according to the invention, a sectional illustration through a planar IGBT with an n$^-$-conducting silicon semiconductor body 1, an additional lightly doped p-conducting collector layer 9, a collector contact layer 10 (K), p-conducting body zones 5, lightly doped n-conducting source zone 6, gate electrodes 11 in an insulating layer 13 made of silicon dioxide with a gate oxide 12 and an aluminum metalization layer 3.

Generally, the layer 9 may act as an emitter and be doped so weakly that, without the amorphous layer 2, a Schottky contact or an ohmic contact with a relatively high contact resistance would be produced.

According to the invention, layers 2 made of amorphous doped silicon are provided below the aluminum metalization 3 in the body zone 5 and the source zone 6 and/or between the p-conducting collector layer 9 and the collector contact layer 10 made likewise of aluminum, in order to enable a relatively low or even negligible doping of the zone 6 and/or of the layer 9. The layers 2 may be n-doped in the region of the source zone 6 and body zone 5 and be p-doped in the region of the collector layer 9. It goes without saying that respectively opposite conduction types are possible for the doping in this case as well.

The layers 2 may be produced by deposition by means of vapor deposition or sputtering in an optionally hydrogen-containing atmosphere, which may be followed by a heat treatment at about 350° C. to 450° C. in likewise a hydrogen-containing atmosphere. However, it is also possible to produce the amorphous layer 2 by means of a glow discharge process in an $SiH_4$ atmosphere. Finally, the amorphous layer need not actually be deposited: rather, it is possible to amorphize the surface of the semiconductor body 1 itself (cf. FIG. 2) by introducing a damage by means of implantation with a non-doping element, such as, in particular, an element of the third period of the periodic table, that is to say silicon or argon, for example. This implantation may be effected with a dose of about $5 \cdot 10^{14}$ to $1 \cdot 10^{16}$ $cm^{-2}$.

The layer 2 may, preferably, also be locally recrystallized in component regions. This recrystallization may be performed at temperatures in excess of about 600° C. Regions which are suitable for a recrystallization are those regions wherein the emitter efficiency is intended to be reduced compared with the rest of the emitter area.

We claim:

1. A contact configuration, comprising:
   a semiconductor body of semiconductor material in a monocrystalline phase, said semiconductor body having one of a trench component and a planar component formed therein, said component being selected from the group consisting of a diode, a bipolar transistor, a MOSFET, and an IGBT;
   a metalization layer formed of a metal selected from the group consisting of aluminum, chromium, and aluminum/chromium; and
   a layer of said semiconductor material in a substantially amorphous phase disposed between said semiconductor body and said metalization layer, for forming an ohmic contact between said metalization layer and said semiconductor body;
   said semiconductor material being silicon and said layer being a layer of amorphous silicon doped with hydrogen.

2. The contact configuration according to claim 1, wherein said silicon semiconductor body is n-conducting in a region of said layer of amorphous silicon.

3. The contact configuration according to claim 1, wherein said silicon semiconductor body is p-conducting in a region of said layer of amorphous silicon.

4. The contact configuration according to claim 1, wherein said layer of amorphous semiconductor material has a thickness in the order of magnitude of nanometers.

5. The contact configuration according to claim 4, wherein said thickness of said layer lies between 2 and 100 nm.

6. The contact configuration according to claim 1, wherein said layer of amorphous semiconductor material has a doping of between $10^{15}$ and $10^{16}$ charge carriers per $cm^3$.

7. The contact configuration according to claim 1, which comprises a field stop zone in said semiconductor body, said field stop zone adjoining said layer of said amorphous semiconductor material.

8. The contact configuration according to claim 1, which further comprises an additional layer in said semiconductor body in a region of said layer of amorphous semiconductor material, said additional layer forming an emitter.

9. The contact configuration according to claim 8, wherein said additional layer and said semiconductor body are of a common conductivity type.

10. The contact configuration according to claim 8, wherein said additional layer and said semiconductor body having mutually opposite conductivity types.

11. The contact configuration according to claim 8, wherein said additional layer is doped so weakly that, without said layer of amorphous semiconductor material, said additional layer forms one of a Schottky contact or an ohmic contact with a relatively high contact resistance.

12. The contact configuration according to claim 1, wherein said layer of amorphous semiconductor material is formed on at least one of a front side and a rear side of said semiconductor body.

13. The contact configuration according to claim 12, wherein said layer of amorphous semiconductor material is formed to locally attenuate an injection of charge carriers in critical component regions.

14. The contact configuration according to claim 1, wherein said layer of amorphous semiconductor material is locally recrystallized.

15. The contact configuration according to claim 1, wherein in said amorphous semiconductor material is silicon carbide.

* * * * *